(12) United States Patent
Balakrishnan et al.

(10) Patent No.: US 9,704,860 B1
(45) Date of Patent: Jul. 11, 2017

(54) EPITAXIAL OXIDE FIN SEGMENTS TO PREVENT STRAINED SEMICONDUCTOR FIN END RELAXATION

(71) Applicant: INTERNATIONAL BUSINESS MACHINES CORPORATION, Armonk, NY (US)

(72) Inventors: Karthik Balakrishnan, White Plains, NY (US); Keith E. Fogel, Hopewell Junction, NY (US); Sivananda K. Kanakasabapathy, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/285,700

(22) Filed: Oct. 5, 2016

(51) Int. Cl.
  *H01L 21/8238* (2006.01)
  *H01L 27/088* (2006.01)
  *H01L 29/161* (2006.01)
  *H01L 29/10* (2006.01)
  *H01L 21/8234* (2006.01)
  *H01L 21/02* (2006.01)

(52) U.S. Cl.
  CPC .... *H01L 27/0886* (2013.01); *H01L 21/02532* (2013.01); *H01L 21/823412* (2013.01); *H01L 21/823431* (2013.01); *H01L 21/823468* (2013.01); *H01L 29/1054* (2013.01); *H01L 29/161* (2013.01)

(58) Field of Classification Search
  CPC ..... H01L 21/823821; H01L 21/823431; H01L 21/845; H01L 21/8238
  See application file for complete search history.

(56) References Cited

U.S. PATENT DOCUMENTS

| 8,766,364 | B2 | 7/2014 | Doornbos et al. |
| 9,362,361 | B1 | 6/2016 | Akarvardar |
| 2016/0013189 | A1 | 1/2016 | Cheng et al. |

(Continued)

FOREIGN PATENT DOCUMENTS

CN  105702725 A  6/2016

OTHER PUBLICATIONS

Disclosed Anonymously, "Method of enhanced channel strain using suspended source/drain FinFETs" IP.com (Jan. 28, 2014) IP.com No. IPCOM000234689D.

(Continued)

*Primary Examiner* — Cuong Q Nguyen
(74) *Attorney, Agent, or Firm* — Tutunjian & Bitetto, P.C.; Daniel P. Morris (57) ABSTRACT

A method of forming a semiconductor device that includes providing regions of epitaxial oxide material on a substrate of a first lattice dimension, wherein regions of the epitaxial oxide material separate regions of epitaxial semiconductor material having a second lattice dimension are different than the first lattice dimension to provide regions of strained semiconductor. The regions of the strained semiconductor material are patterned to provide regions of strained fin structures. The epitaxial oxide that is present in the gate cut space obstructs relaxation of the strained fin structures. A gate structure is formed on a channel region of the strained fin structures separating source and drain regions of the fin structures.

11 Claims, 9 Drawing Sheets

(56) References Cited

U.S. PATENT DOCUMENTS

2016/0064288 A1* 3/2016 Cheng .................. H01L 29/165
                                                      257/192
2016/0172497 A1    6/2016 Loubet et al.
2016/0190304 A1    6/2016 Morin et al.

OTHER PUBLICATIONS

Witters, L. et al., "Strained Germanium Quantum Well pMOS FinFETs Fabricated on in situ Phosphorus-Doped SiGe Strain Relaxed Buffer Layers Using a Replacement Fin Process" IEEE International Electron Devices Meeting (IEDM) (Dec. 2013) pp. IEDM13-534-IEDM13-537.

* cited by examiner

EPITAXIAL OXIDE FIN SEGMENTS TO PREVENT STRAINED SEMICONDUCTOR FIN END RELAXATION

BACKGROUND

Technical Field

The present disclosure relates to fin structures, and more particularly to fin structures including strained materials.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (FinFET). Further, strain based enhancements have been contemplated for increasing carrier speeds in semiconductor devices.

SUMMARY

In one aspect, a method is provided for forming fin structures composed of strained semiconductor material. The method may include forming a hard mask on a semiconductor substrate of a first lattice dimension, and etching first openings into a first portion of the semiconductor substrate exposed by the hard mask. An epitaxial oxide having a second lattice dimension than the first lattice dimension of the semiconductor substrate may then be formed in openings. A second portion of the semiconductor substrate may then be etched using the epitaxial oxide as an etch mask to form second opening in the semiconductor substrate. An epitaxial deposited semiconductor material having the second lattice dimension that is different than the first lattice dimension may be formed in the second openings, wherein a difference between the first lattice dimension and the second lattice dimension induces a strain in the epitaxial deposited semiconductor material. Each region of epitaxial deposited semiconductor material is patterned to provide fin structures. The epitaxial oxide is present in the fin cut space and obstructs relaxation of the fin strain.

In another aspect, a method is provided for forming a semiconductor device including fin structures having of a strained semiconductor material. In one embodiment, the method includes providing regions of epitaxial oxide material formed on a substrate of a first lattice dimension, wherein regions of the epitaxial oxide material separate regions of epitaxial semiconductor material having a second lattice dimension different than the first lattice dimension to provide regions of strained semiconductor. The regions of strained semiconductor are patterned to provide regions of strained fin structures, wherein the epitaxial oxide is present in the fin cut space to obstruct relaxation of the strained fin structures. A gate structure is formed on a channel region of the strained fin structures separating source and drain regions of the fin structures.

In another aspect of the present disclosure, a semiconductor device is provided that includes a plurality of fin structures having a uniform strain extending from edge to edge of each fin structure in said plurality of fin structures. A gate structure is present on a channel region of the fin structures having the uniform strain. Source and drain regions are formed on opposing sides of the channel region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is related to fin type field effect transistors, and other electrical devices including fin structures. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel of the fin structure A FinFET is a semiconductor device that positions the channel region of the semiconductor device in a fin structure. The source and drain regions of the fin structure are the portions of the fin structure that are on opposing sides of the channel region of the fin structure.

It has been determined that introducing strain to semiconductor devices can increase carrier speed. For example, a compressive strain can increase the speed of hole type carriers in p-type semiconductor devices, and a tensile strain can increase the speed of electron type carriers in n-type semiconductor devices. In some embodiments, compressive and tensile strain can be produced in a semiconductor device by epitaxially growing the semiconductor material on a deposition surface having a lattice dimension that is different from the epitaxial material being formed.

It has been determined that in some examples, fin structures composed of strained semiconductor materials tend can partially relax or can fully relax when the fin structures are cut. More specifically, when a fin structure that is composed of a strained semiconductor material is sections to provide two adjacent fin structures separated by a fin cut opening between the source/drain edges of a fin structure, the strained semiconductor material can experience relaxation. In some embodiments, the fin structures relax along their entirety, and in some embodiments, the fin structures relax at their edges. In the examples, in which the strain entirely relaxes, the entire performance advantage that can be provided by the strained materials is lost. In the examples when the fin structures relax at their edges, but maintain strain at their central portions, there is an inconsistent strain profile that can also degrade device performance.

In some embodiments, the methods and structures disclosed herein can eliminate the incidence of fin end relaxation after the fin cut by positioning epitaxial oxide material in the regions where the fin cut would occur. In some embodiments, by using the fin cut mask prior to strained semiconductor formation on the silicon substrate, regions of epitaxial oxide can be formed. The strained semiconductor material is then grown around the epitaxial oxide. When fin structures are formed from the strained semiconductor material the fin now includes a epitaxial oxide segment, as opposed to a gap, in which the epitaxial oxide keeps the semiconductor fin end from relaxing. The effect can be further enhanced by growing an epitaxial oxide lattice matched to the lattice constant of the strained semiconductor material. The methods and structures disclosed herein, are now described in greater detail with reference to FIGS. 1A-11B.

Figure 1A:
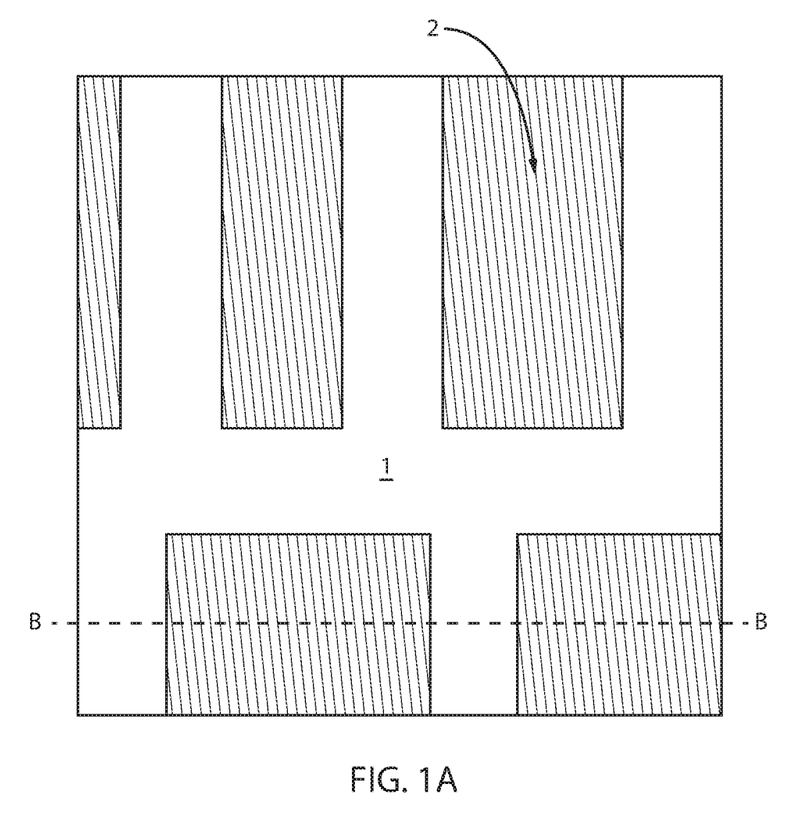
FIG. 1A is a top down view depicting forming a fin cut mask on a semiconductor substrate having a first lattice dimension, in accordance with one embodiment of the present disclosure.
Figure 1B:
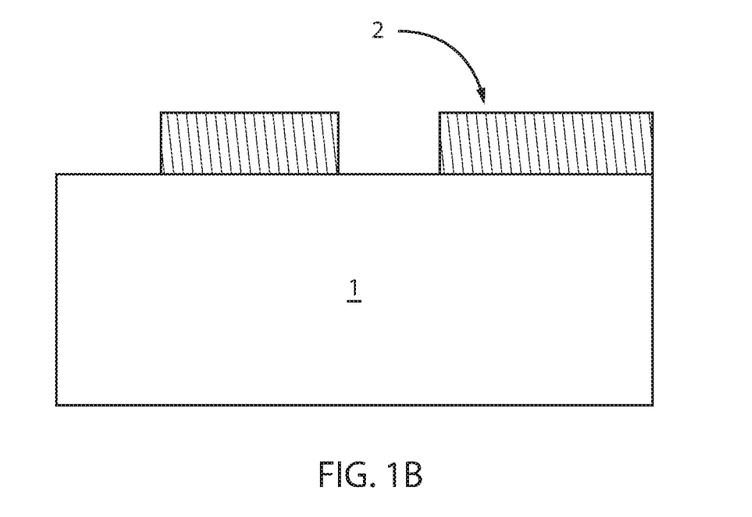
FIG. 1B is a side cross-sectional view of the fin cut mask being formed on the semiconductor substrate that is depicted in FIG. 1A along section line B-B.

FIGS. 1A and 1B depict forming a fin cut mask 5 on a semiconductor substrate 1 having a first lattice dimension. The semiconductor substrate 1 may be composed of any semiconductor material. For example, the semiconductor substrate 1 may be composed of a type IV or type III-V semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. The semiconductor substrate may also be composed of a type III-V semiconductor material, such as GaAs.

The term "lattice dimension", also referred to as lattice constant, or lattice parameter, refers to the physical dimension of unit cells in a crystal lattice of a semiconductor material. For example, the lattice dimension of silicon (Si) is 5.431 Å, and the lattice dimension for germanium (Ge) is 5.65791 Å.

The fin cut mask 2 may be composed of a hard mask dielectric, and in some embodiments may be composed of a photoresist material. The term "fin cut" when used to describe the fin cut mask 2 refers to the position of the mask relative to the later formed fin structures, in which the fin cut provides the space between the edges, i.e., ends of the source and drain region portions of the fin structures, that are adjacent and aligned fin structures. In the embodiments, in which the fin cut mask 2 is composed of a hard mask material, the dielectric used for the hard mask may be an oxide, nitride or oxynitride material. For example, the hard mask material that provides the fin cut mask 2 may be silicon nitride. The fin cut mask 2 may be formed using a deposition process to form the dielectric layer that is patterned using photolithography and etch processes. The material layer for the fin cut mask 2 may be blanket deposited using chemical vapor deposition, e.g., plasma enhanced chemical vapor deposition (PECVD). The hard mask dielectric layer may then be patterned using photolithography and etch process to provide the geometry of the fin cut mask 2 that produces the first openings in the substrate 1, which can begin with forming a photoresist block mask. A photoresist block mask can be produced by applying a photoresist layer, exposing the photoresist layer to a pattern of radiation, and then developing the pattern into the photoresist layer utilizing conventional resist developer.

The portions of the hard mask dielectric layer that are protected by the photoresist block mask remain to provide a fin cut mask 2 composed of a hard mask dielectric, and the portions of the dielectric layer that are not protected by the photoresist block mask are removed by an etch process. The etch process for removing the exposed portions of the hard mask dielectric layer in patterning the fin cut mask 2 may be an anisotropic etch, such as reactive ion etch or laser etch, or an isotropic etch, such as a wet chemical etch.

Figure 2A:
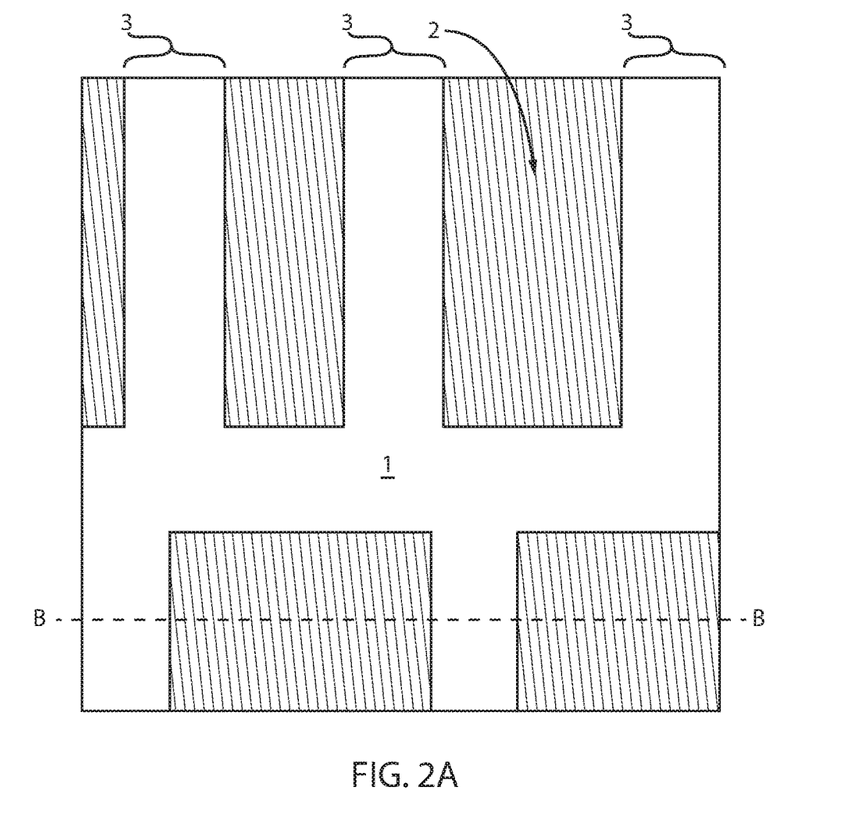
FIG. 2A is a top down view depicting etching a first portion of the semiconductor substrate using the fin cut mask to form a first plurality of openings that provide fin cut openings.
Figure 2B:
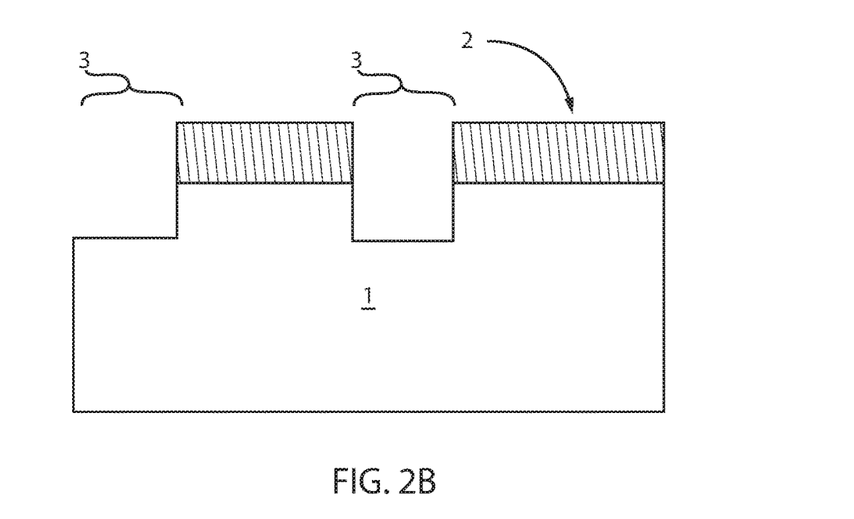
FIG. 2B is a side cross-sectional view depicting a side cross-sectional view of the structure depicted in FIG. 2A along section line B-B.

Following formation of the fin cut mask 2, the exposed portions of the semiconductor substrate 1 having the first lattice dimension may be etched, i.e., removed, to provide first openings 3, as depicted in FIGS. 2A and 2B. In one embodiment, the etch process for etching the semiconductor substrate 1 for forming the first openings 3 may be an anisotropic etch. An "anisotropic etch process" denotes a material removal process in which the etch rate in the direction normal to the surface to be etched is greater than in the direction parallel to the surface to be etched. One form of anisotropic etching that is suitable for etching the first openings 3 into the semiconductor substrate 1 is reactive ion etching (RIE).

Figure 3A:
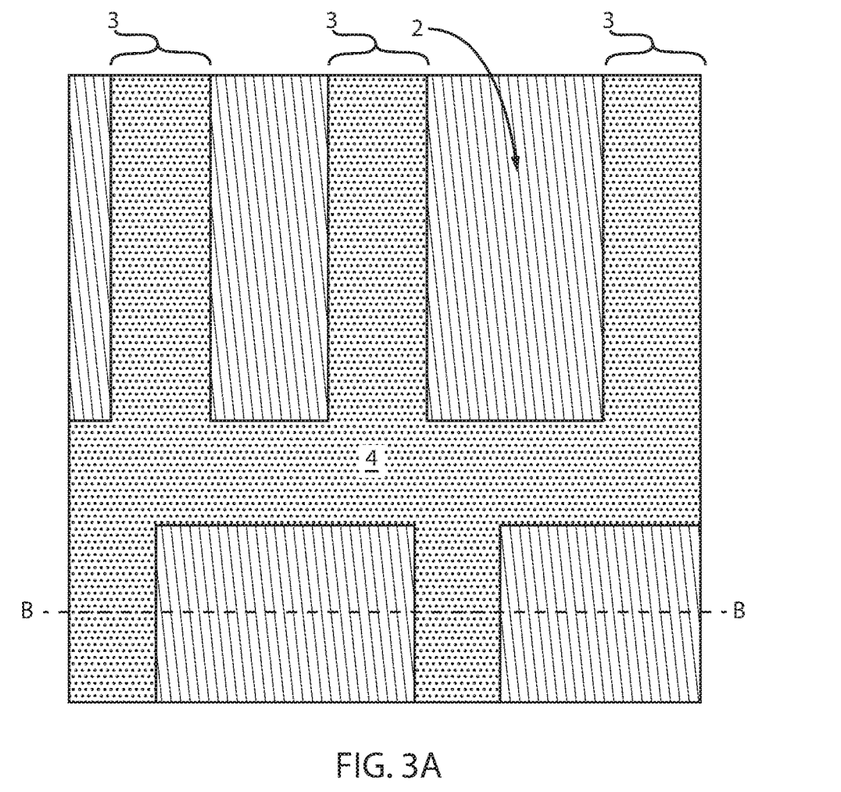
FIG. 3A is a top down view depicting forming an epitaxial oxide in the first openings formed in the semiconductor substrate that provide the fin cut openings.
Figure 3B:
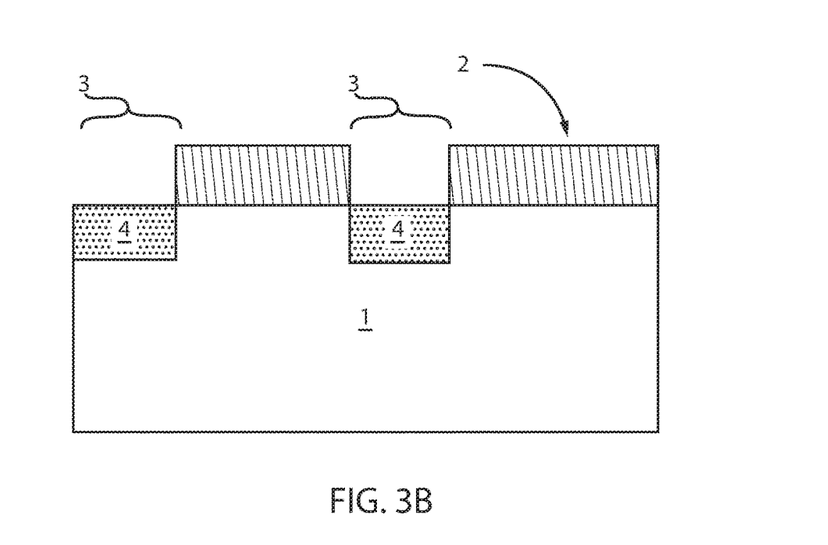
FIG. 3B is a side cross-sectional view of the structure depicted in FIG. 3A along section line B-B.

FIGS. 3A and 3B depict forming an epitaxial oxide 4 in the first openings formed in the semiconductor substrate 1 that provide the solid material filling the fin cut openings, i.e., space, separating adjacent ends of the subsequently formed fin structures, i.e., strained fin structures. The epitaxial oxide 4 may be selected to have a lattice dimension substantially similar to the lattice dimension of the later formed strained semiconductor material 6 that is epitaxially grown on the semiconductor substrate 1.

In one example, the epitaxial oxide 4 is lanthanum (La) and oxygen (O) containing material, which has a lattice dimension that can be closely matched to a silicon lattice. In one embodiment, the epitaxial oxide 4 that is composed of lanthanum (La) and oxygen (O) can be a $(La_xY_{1-x})_2O_3$ alloy. The epitaxial oxide 4 is lanthanum (La) and oxygen (O) containing material, e.g., $(La_xY_{1-x})_2O_3$ alloy, may be epitaxially deposited. Other examples of epitaxial oxides that are suitable for use as the epitaxial oxide 4 that is depicted being formed in FIGS. 3A and 3B can be selected from the group consisting of cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$) or combinations thereof.

"Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface, e.g., the epitaxial oxide, will take on a {100} orientation.

In some embodiments, e.g., when the epitaxial oxide 4 is composed of a lanthanum and oxygen containing material, e.g., metastable $(La_xY_{1-x})_2O_3$ alloy, the epitaxial oxide 4 may be formed using molecular beam epitaxial (MBE) deposition. In MBE, material is sublimated (or evaporated in the case of a liquid source) from effusion cells, thus forming molecular beams that are incident upon a heated sample, i.e., deposition surface. In MBE, the molecules of the deposited material land on the surface of the substrate, condense, and build up slowly and systematically, i.e., providing epitaxial growth.

In some embodiments, the epitaxial oxide 4 is deposited to a thickness that fills the first openings 3. In the embodiment depicted in FIGS. 3A and 3B, the upper surface of the epitaxial oxide 4 may be substantially coplanar with the upper surface of the semiconductor substrate 1 that has not been etched. In some embodiments, the height of the epitaxial oxide 4 may be selected to provide epitaxial oxide regions having a height that will be substantially coplanar with the height of later epitaxially formed strained semiconductor material 6 that provides the fin structures. This embodiment provides that an entire sidewall of the strained fin structures is in contact with epitaxial oxide.

Figure 4:
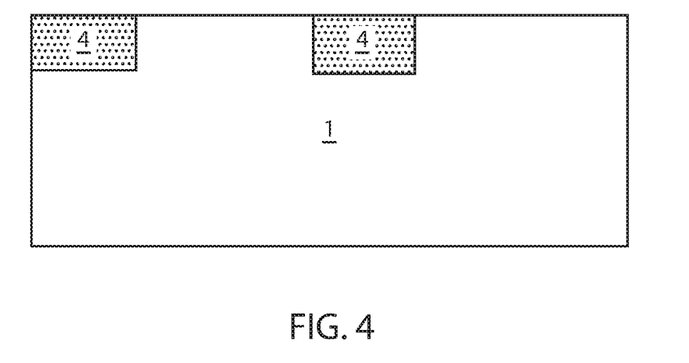
FIG. 4 is a side cross-sectional view depicting removing the fin cut mask.

FIG. 4 depicts removing the fin cut mask 2. The fin cut mask 2 may be removed using a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The fin cut mask 2 may be removed using an etch that is selective to the epitaxial oxide 4, and in some embodiments the underlying semiconductor substrate 1.

Figure 5:
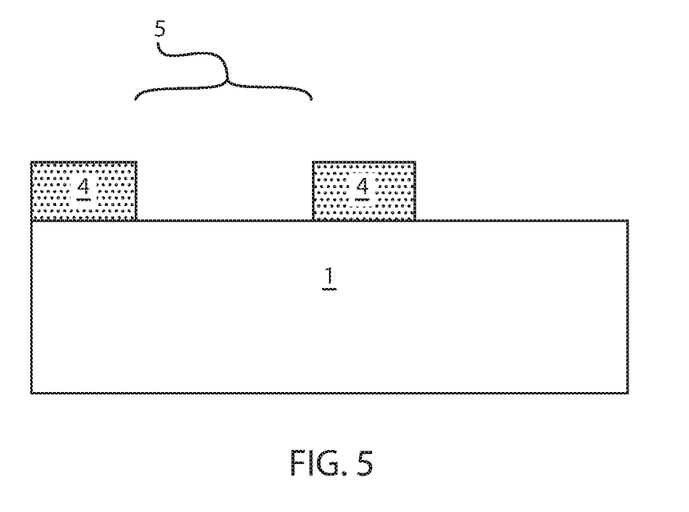
FIG. 5 is a side cross-sectional view depicting etching a second portion of the semiconductor substrate to provide a second plurality of openings for forming fin structures regions.

FIG. 5 depicts etching a second portion of the semiconductor substrate 1 to provide a second plurality of openings 5 for forming regions of fin structures. The etch process depicted in FIG. 5 can employ the epitaxial oxide 4 as an etch mask. The etch process for forming the second openings 5 may be a selective etch process, i.e., an etch process that is selective to the epitaxial oxide. The etch process can be an anisotropic etch process, such as reactive ion etch. The depth by which the exposed portions of the semiconductor substrate 1 is etched to provide the second openings 5 can be selected to dictate the height of the later formed fin structures, as the recessed surfaces of the second openings 5 may provide the epitaxial growth surface of the epitaxially deposited semiconductor material that is processed to provide the strained fin structures.

Figure 6A:
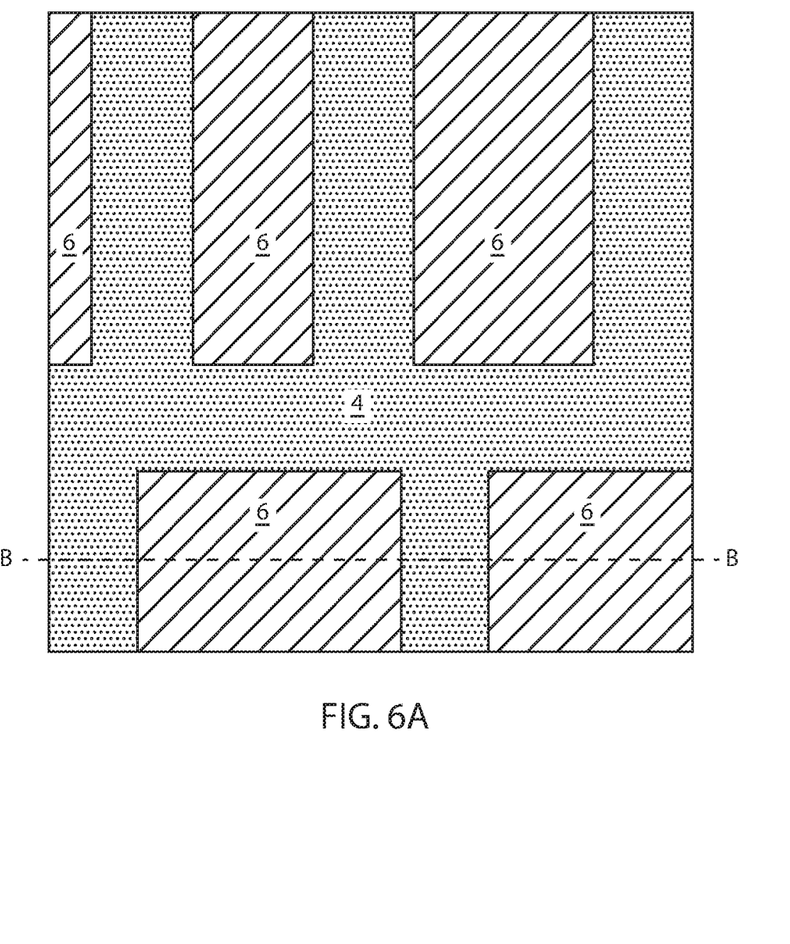
FIG. 6A is a top down view depicting forming an epitaxially deposited semiconductor material formed in the second plurality of openings having a second lattice dimension that is different than the first lattice dimension of the semiconductor substrate.
Figure 6B:
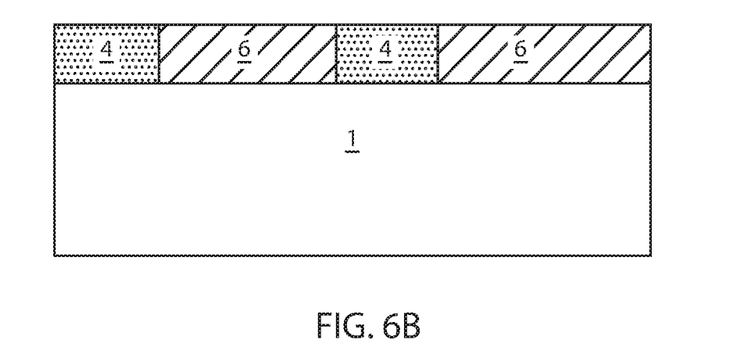
FIG. 6B is a side cross-sectional view of the structure depicted in FIG. 6A along section line B-B.

FIGS. 6A and 6B depict forming an epitaxially deposited semiconductor material 6 formed in the second plurality of openings 5 having a second lattice dimension that is different than the first lattice dimension of the semiconductor substrate 1, wherein the epitaxially deposited semiconductor material 6 is formed with an intrinsic strain that results from the difference in lattice dimensions of the two interfacing materials. For example, in embodiments, in which the epitaxially deposited semiconductor material 6 is composed of a silicon and germanium containing semiconductor that is epitaxially formed on a semiconductor substrate 1 that is composed of silicon (Si), the larger lattice constant of the epitaxially deposited semiconductor material 6 in epitaxial relationship with smaller deposition surface provided by the silicon (Si) semiconductor substrate will result in the epitaxially deposited semiconductor material 6 having a compressive strain.

In some embodiments, the content of the epitaxial oxide 4, and the epitaxially deposited semiconductor material 6, is selected so that the lattice dimensions substantially match. In some embodiments, the epitaxially deposited semiconductor material 6 may be silicon germanium (SiGe) having a germanium (Ge) content ranging from 15 wt. % to less than 30 wt. %. In other embodiments, the germanium (Ge) of the silicon germanium (SiGe) that provides the epitaxially deposited semiconductor material 6 content ranges from 15 wt. % to 25 wt. %. In one example, the germanium content in the silicon germanium (SiGe) that provides the epitaxially deposited semiconductor material 6 is equal to 20 wt. %. Turning to the epitaxial oxide 4, in some embodiments, when using yttrium/lanthanum-oxide based systems, such as $(La_xY_{1-x})_2O_3$, the yttrium has to be the majority compound to ensure that a cubic lattice is formed. For example, the cubic lattice of the yttrium/lanthanum-oxide based systems matches well with the Si/SiGe lattice. In some embodiments, when the epitaxially deposited semiconductor material 6 is composed of silicon (Si) and germanium (Ge), the La—Y-oxide based interlayer system is only suitable for use with silicon germanium (SiGe) material having a germanium (Ge) content of 25 at. % or less. Other combinations of materials and compositions for the epitaxial oxide 4 and the epitaxially deposited semiconductor 6 are also possible. For example, the epitaxially deposited semiconductor material 6 may be any material that can be formed on the exposed surface of the semiconductor substrate 1. Epitaxial oxides might include a rare earth oxide. The rare earth oxide may include binary oxides, such as, e.g., gadolinium(III)-oxide $(Gd_2O_3)$, dysprosium(III)-oxide $(Dy_2O_3)$, holmium(III) oxide $(Ho_2O_3)$, erbium (III) oxide $(Er_2O_3)$, thulium (III) oxide $(Tm_2O_3)$, lutetium(III) oxide $(Lu_2O_3)$ or cerium (IV) oxide $(CeO_2)$, etc. or ternary oxides including a rare earth metal, such as e.g., Gd, Er, Nd, La and Y forming oxides such as, e.g., lanthanum-yttrium oxide $((La_xY_{1-x})_2O_3)$, gadolinium-erbium oxide $((Gd_xEr_{1-x})_2O_3)$, neodymium-erbium oxide $((Nd_xEr_{1-x})_2O_3)$, neodymium-gadolinium oxide $((Nd_xGd_{1-x})_2O_3)$, lanthanum-erbium oxide $((La_xEr_{1-x})_2O_3)$, and combinations thereof.

For example, in addition to silicon germanium (SiGe), the epitaxial deposited semiconductor material 6 can be any type IV and/or type III-V semiconductor material. It is noted that silicon germanium (SiGe) formed on a silicon (Si) semiconductor substrate 1 provides an epitaxially deposited semiconductor material 6 having a compressive strain. Similar results can be produced by employing a germanium (Ge) epitaxially deposited semiconductor material 6 that is formed on a silicon (Si) semiconductor substrate 1; or a silicon germanium (SiGe) epitaxially deposited semiconductor material 6 that is epitaxially formed on a silicon germanium (SiGe) semiconductor substrate 1, in which the germanium (Ge) content in the epitaxially deposited semiconductor material 6 is greater than the germanium (Ge) content in the semiconductor substrate 1. In some embodiments, to provide a epitaxially deposited semiconductor material 6 that has an intrinsic tensile strain, the composition of the epitaxially deposited semiconductor material 6 is selected to have a lesser a lattice dimension than the surface on which the epitaxially deposited semiconductor material is formed. No— nobody will use Si:C as channel material, since the carbon kills mobility. In other embodiments, to provide a tensile strained material for providing fin structures, the epitaxially deposited semiconductor material 6 may be composed of silicon (Si), while the semiconductor substrate 5 is composed of germanium (Ge) or silicon germanium (SiGe). In yet another embodiment, to provide a tensile strained material, the epitaxially deposited semiconductor material 6 may be composed of silicon and germanium, e.g., silicon germanium (SiGe), and the semiconductor substrate 1 may be composed of silicon and germanium, e.g., silicon germanium (SiGe), in which the germanium content in the epitaxial deposited semiconductor material 6 may be less than the germanium content of the semiconductor substrate 1.

The epitaxially deposited semiconductor material 6 may be formed using a chemical vapor deposition apparatus (CVD), such as plasma enhanced chemical vapor deposition (PECVD), metal organic chemical vapor deposition (MOCVD), atmospheric pressure CVD (APCVD), low pressure CVD (LPCVD) and combinations thereof. A number of different sources may be used for the deposition of the epitaxially deposited semiconductor. In some embodiments, a germanium gas source may be selected from the group consisting of germane $(GeH_4)$, digermane $(Ge_2H_6)$, halogermane, dichlorogermane, trichlorogermane, tetrachlorogermane and combinations thereof. Silicon sources for deposition may be selected from the group consisting of silane, disilane, trisilane, tetrasilane, hexachlorodisilane, tetrachlorosilane, dichlorosilane, trichlorosilane, and combinations thereof. We don't have carbon.

Figure 7A:
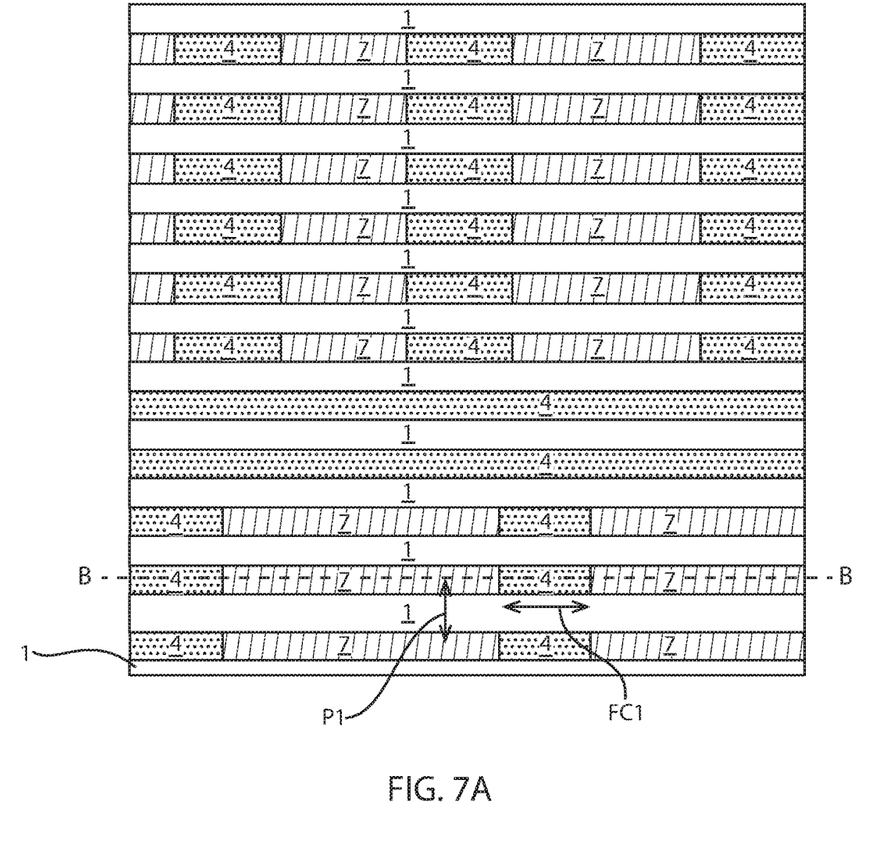
FIG. 7A is a top down view depicting patterning the regions of the epitaxially deposited semiconductor material to provide fin structures, in which the epitaxial oxide is present between the source and drain edges of adjacent fin structures to obstruct strain relaxation in the fin structures.
Figure 7B:
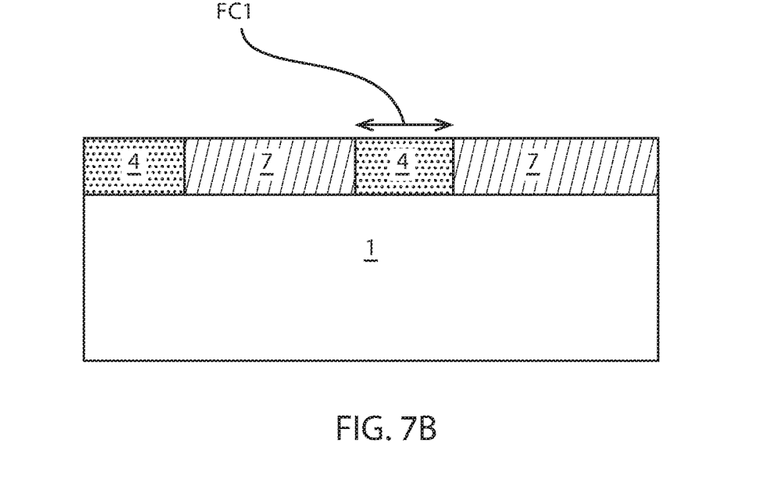
FIG. 7B is a side cross-sectional view depicting the structure depicted in FIG. 7A along section line B-B.

FIGS. 7A and 7B depicting patterning the regions of the epitaxially deposited semiconductor material 6 to provide fin structures 7, in which the epitaxial oxide 4 is presents between the source and drain edges of adjacent fin structures 7 to obstruct strain relaxation in the fin structures 7.

In one embodiment, the patterning process used to define each of the fin structures 7 is a sidewall image transfer (SIT) process. The SIT process can include forming a mandrel material layer (not shown) on the epitaxially formed semiconductor material 6 that provides the fin structures 7. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 7.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 7.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structures 7, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structures 7. Following etching, i.e., pattern transfer, the SIT process may conclude with removing the dielectric spacers using an etch process or a planarization process.

Each of the fin structures 7 may have a height ranging from 5 nm to 200 nm. In another embodiment, each of the fin structures 7 has a height ranging from 10 nm to 100 nm. In one example, each of the fin structures 7 has a height ranging from 20 nm to 50 nm. It is noted that the height of the fin structures 7 may be equal to the height of the epitaxial oxide 4. Each of the plurality of fin structures 7 may have a width of less than 20 nm. In another embodiment, each of the fin structures 7 has a width ranging from 3 nm to 8 nm. The pitch P1 separating adjacent fin structures 7 may range from 35 nm to 45 nm. In another example, the pitch separating adjacent fin structures 7 may range from 30 nm to 40 nm.

Figure 8:
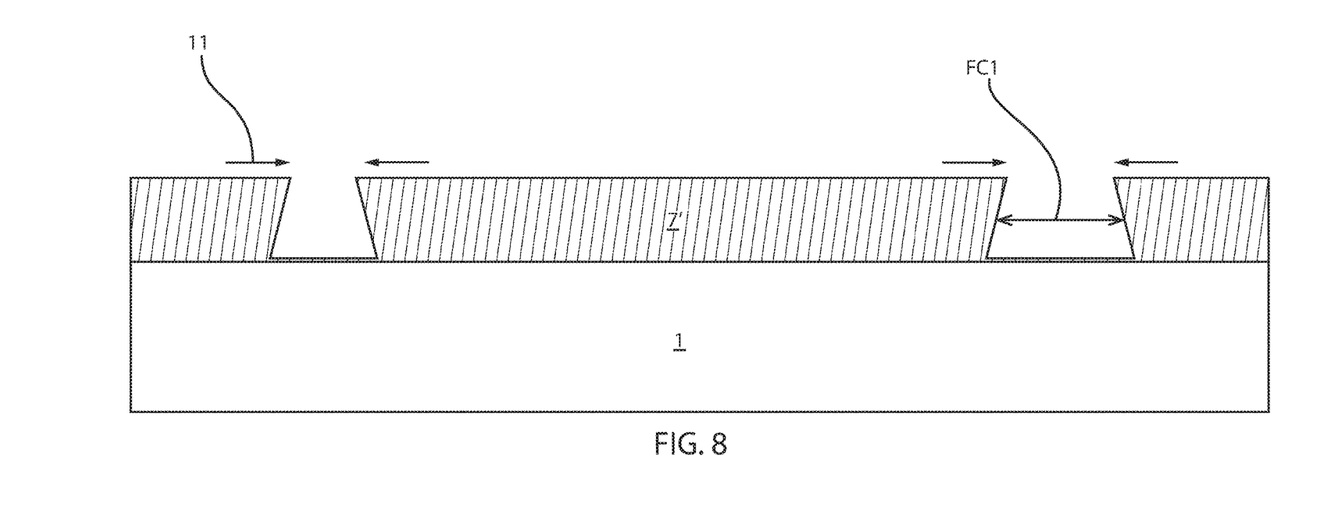
FIG. 8 is a side cross-sectional view depicting relaxation of the strain in fin structures when the epitaxial oxide is removed.

FIG. 8 depicts relaxation of the strain in the fin structures 4 that has been discovered if the epitaxial oxide 4 is not present filling the fin cut opening. The fin cut opening is the space between the edges, i.e., the outermost edge of the source/drain regions portions of the fin structures, which is separating adjacent fin structures 4. This space, i.e., the fin cut space, has length dimension, i.e., the dimension from one edge of a first fin structure to an edge of second adjacent fins structure, that is perpendicular to the dimension that defines the pitch P1 between adjacent fin structures 7. The length of the fin cut dimension is depicted in the supplied figures as FC1.

As illustrated in FIG. 8, freestanding strained semiconductor fin structures 7', such as those having a height on the order of 40 nm to 60 nm, typically experience strain relaxation in the directions illustrated by arrows having reference number 11. This strain relaxation is depicted, although an exaggeration, with the deformation of the sidewalls of the fin structures 7' after the fin cut FC1 etch that removes a portion of the fin structure to provide two adjacent fin structures 7' separated by a fin cut gap. Because, there is nothing within the fin cut gap to confine the fin edge structures from deformation that results from the intrinsic strain produced by the difference in lattice dimensions between the epitaxially formed fin structure material and the underlying growth surface, i.e., semiconductor substrate 1, the structures can deform as the strain relaxes typically at the fin edges, and in some examples across the entirety of the fin structure 7'.

Figure 9:
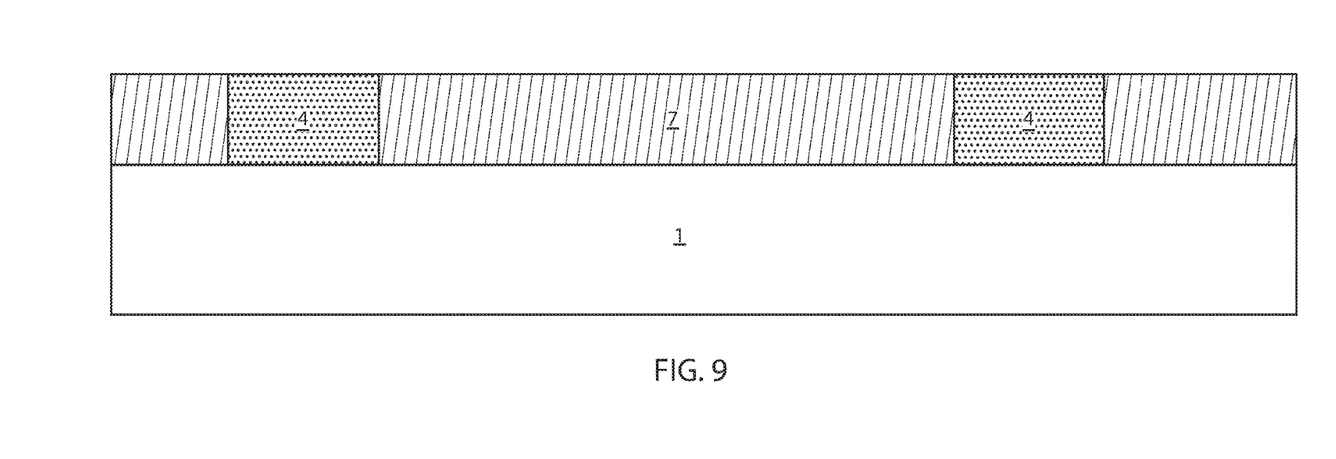
FIG. 9 is a side cross-sectional view depicting obstruction of the strain relaxation in the fin structures that is provided by the epitaxial oxide being positioned in the fin cut space between adjacent fin structures.

FIG. 9 illustrates how in some embodiments, the epitaxial oxide 4 that is present in the fin cut gap FC1 prior to fin patterning, as described in FIGS. 7A-7B, and after fin patterning, obstructs strain relaxation. For example, the epitaxial oxide 4 can confine the strained epitaxial semiconductor material 6 during growth, and can maintain or enhance the strain in the strained semiconductor fin 7 after the fin cut, because the epitaxial oxide 4 obstructs any deformation of the fin structures 7 that typically would occur if the epitaxial oxide 4 was not present in the fin cut opening between adjacent fin structures 7. As depicted in FIG. 9, there is no deformation of the edges of the fin structures 7 when the epitaxial oxide is present in the fin cut gap.

Figure 10A:
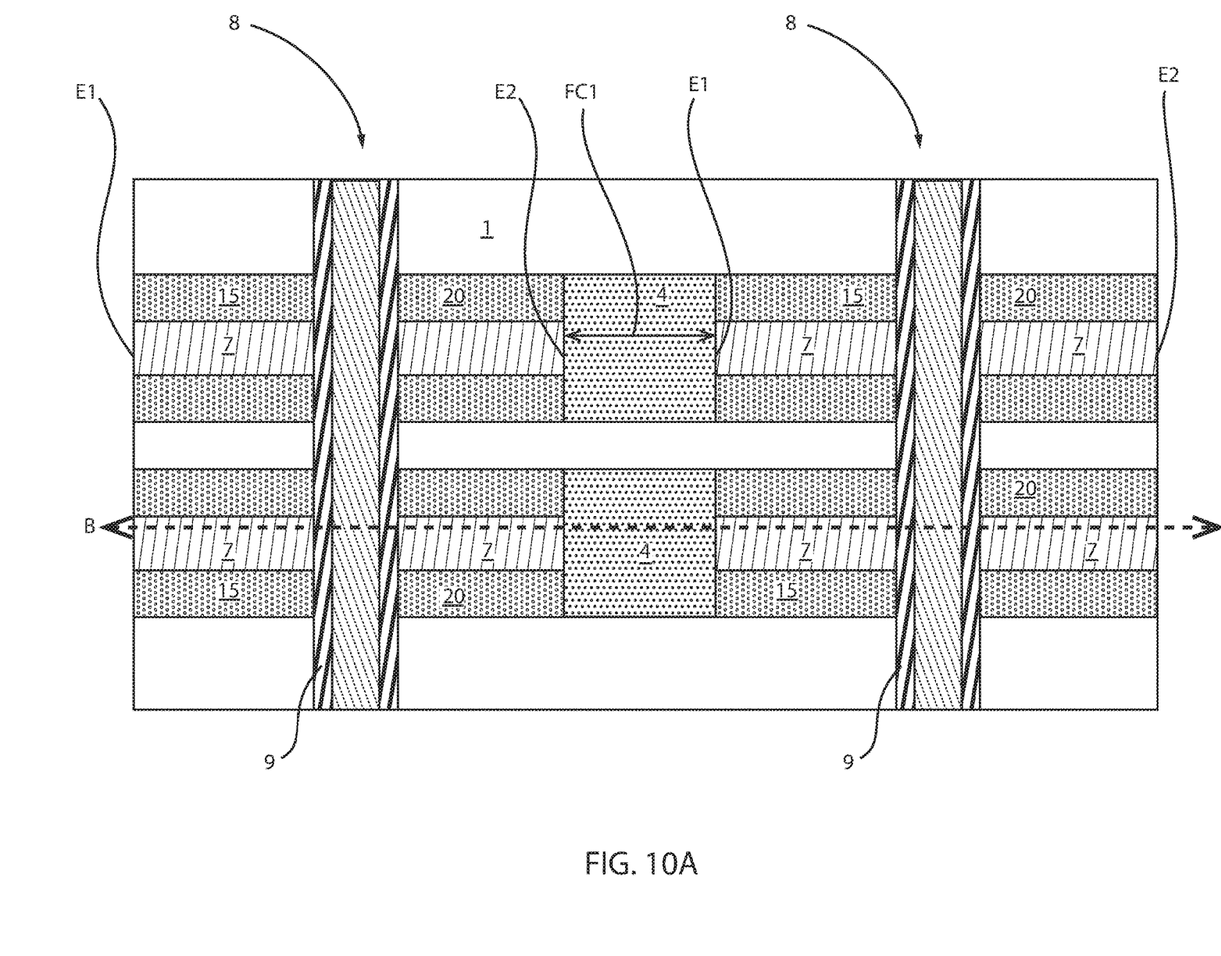
FIG. 10A is a top down view of a FinFET including the strained fin structures and epitaxial oxide materials that are described with reference to FIGS. 1-9.
Figure 10B:
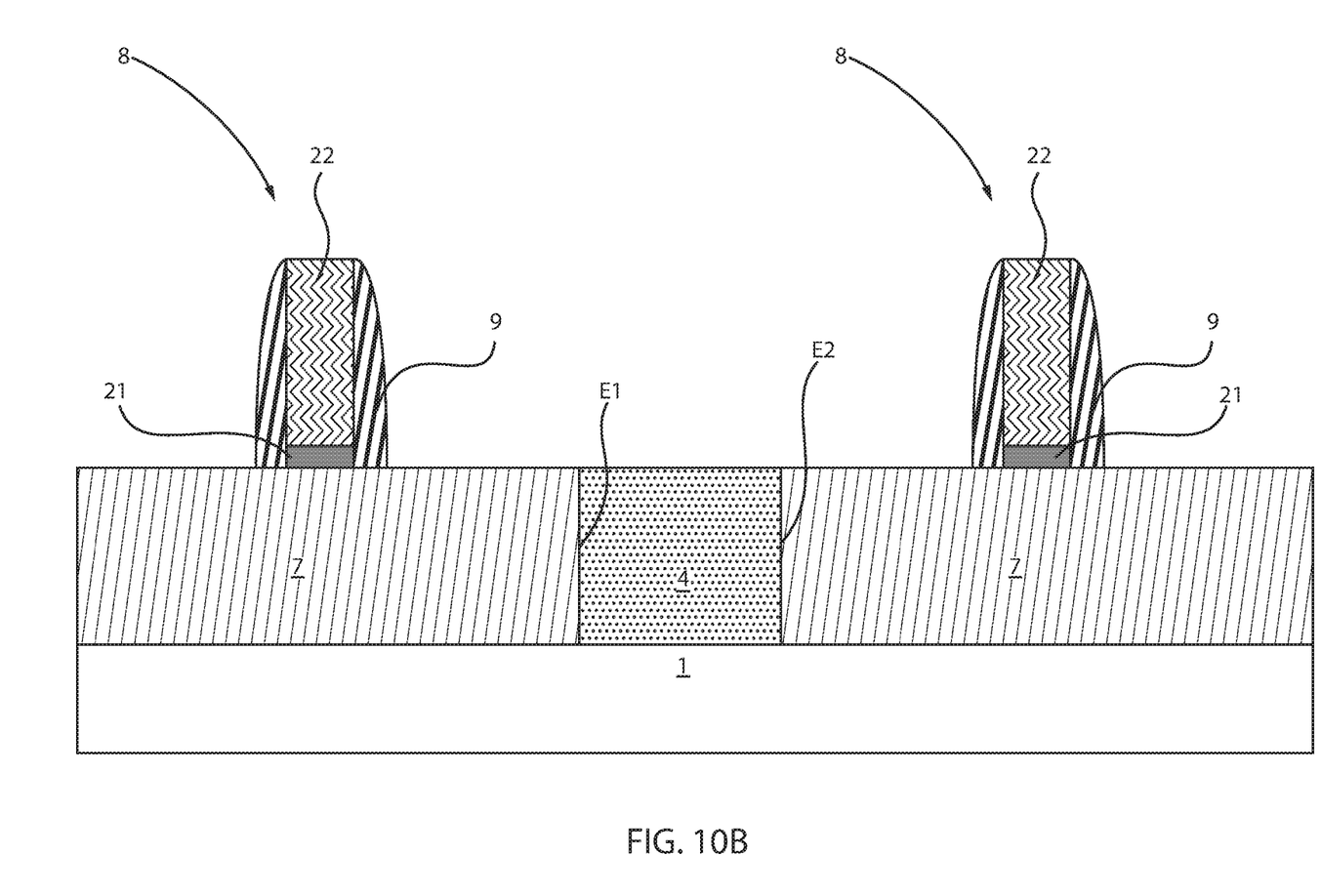
FIG. 10B is a side cross-sectional view of the structure depicted in FIG. 10A along section line B-B.

FIGS. 10A and 10B depict a FinFET including the strained fin structures 7 and epitaxial oxide materials 10 that are described with reference to FIGS. 1-9. The FinFET devices depicted in FIGS. 10A and 10B are only formed on a portion of the fin structures 7 depicted in FIGS. 1-9. The semiconductor device may include a plurality of fin structures 7 having a uniform strain extending from edge E1 to edge E2 of each fin structure. An epitaxial oxide 4 may be present in the fin cut opening present between edges E1, E2 of said plurality of fin structures 7. A gate structure 8 may be present on a channel region of the fin structures 7. A source region 15, and drain region 20 may be formed on portions of the fin structure 7 that are on opposing sides of the channel region.

The "gate structure" functions to switch the semiconductor device from an "on" to "off" state, and vice versa. The gate structure 8 are formed on the channel region of each the fin structures 7 that will be processed to form semiconductor devices, e.g., FinFETs. The gate structure 8 typically includes at least a gate dielectric 21 that is present on the channel region of the fin structure 7, and a gate electrode 22 that is present on the gate dielectric 21. In one embodiment, the at least one gate dielectric layer 21 includes, but is not limited to, an oxide, nitride, oxynitride and/or silicates including metal silicates, aluminates, titanates and nitrides. In one example, when the at least one gate dielectric layer 21 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 21 may vary, but typically, the at least one gate dielectric layer 21 has a thickness from 1 nm to 10 nm. In another embodiment, the at least one gate dielectric layer 21 has a thickness from 1 nm to 3 nm.

The conductive material of the gate electrode 22 may comprise polysilicon, SiGe, a silicide, a metal or a metal-silicon-nitride such as Ta—Si—N. Examples of metals that can be used as the gate electrode 22 include, but are not limited to, Al, W, Cu, and Ti or other like conductive metals. The layer of conductive material for the gate electrode 22 may be doped or undoped. If doped, an in-situ doping deposition process may be employed. Alternatively, a doped conductive material can be formed by deposition, ion implantation and annealing.

The gate structure 8 may be formed by using a deposition method, such as a chemical vapor deposition method and/or a physical vapor deposition (PVD), to deposit the material layers for the at least one gate dielectric layer and the at least one gate electrode followed by photolithography and etch processing.

Still referring to FIGS. 10A and 10B, a gate sidewall spacer 9 may be formed on the sidewalls of the gate structure 8. The gate sidewall spacer 9 may be composed of a dielectric material, such as silicon nitride, and is formed using deposition processes, such as chemical vapor deposition, followed by etch back processes, such as reactive ion etch (RIE).

In a following process step, the source and drain regions 20, 25 may be formed on the source and drain regions portions of the fin structures 7 that are present on opposing sides of the channel region of the fin structures 7.

FIGS. 10A and 10B depict forming doped epitaxial semiconductor material on the source and drain portions of the fin structures 7. The epitaxial material formed on the fin structures of Fin Field Effect Transistors (FinFET) may provide a component of the source and drain regions 20, 25 of the FinFET. In this example, the epitaxial semiconductor material may be formed on the source and drain region 20, 25 portions of the fin structures 10, which are on opposing sides of the channel portion of the fin structure 10 that the gate structure 15 is present on.

In some embodiments, the epitaxial semiconductor material for the source and drain regions 20, 25 may be composed of silicon (Si), germanium (Ge), silicon germanium (SiGe), silicon doped with carbon (Si:C) or the epitaxial semiconductor material 30 may be composed of a type III-V compound semiconductor, such as gallium arsenide (GaAs). The epitaxial semiconductor material that provides the source and drain regions 20, 25 may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In the embodiments in which the FinFET device being formed has n-type source and drain regions 20, 25, and is referred to as an n-type FinFET, the doped epitaxial semiconductor material is doped with an n-type dopant to have an n-type conductivity. In the embodiments in which the FinFET device being formed has p-type source and drain regions 20, 25, and is referred to as a p-type FinFET, the doped epitaxial semiconductor material is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). The p-type gas dopant source may include diborane ($B_2H_6$). In some embodiments, the n-type or p-type dopant may be present in the doped epitaxial semiconductor material of the source and drain regions 20, 25 in a concentration ranging from $1 \times 10^{20}$ to $5 \times 10^{21}$ atoms/cm$^3$. In another embodiment, the n-type or p-type dopant may be present in the doped epitaxial semiconductor material of the source and drain regions 20, 25 in a concentration ranging from $4 \times 10^{20}$ to $2 \times 10^{21}$ atoms/cm$^3$.

It is noted that the source and drain regions 20, 25 of different semiconductor devices in different regions of the substrate may be individually processed using block masks. This can provide n-type and p-type semiconductor devices on the same semiconductor substrate 1.

In one embodiment, dopant from the doped epitaxial semiconductor material of the source and drain regions 20, 25 is diffused into the underlying portions of the fin structures 7 to form extension dopant regions. In some embodiments, the diffusion, i.e., driving, of the dopant from the doped epitaxial semiconductor material 30 into the extension region portions of the fin structures 10 comprises thermal annealing. In one embodiment, the thermal annealing that diffuses the dopant from the doped epitaxial semiconductor material 30 into the extension region portions of the fin structures 10 includes an annealing process selected from the group consisting of rapid thermal annealing (RTA), flash lamp annealing, furnace annealing, laser annealing and combinations thereof.

As noted above, the FinFETs depicted in FIGS. 10A and 10B can be formed having strained fin structures 7, in which the strain present in the fin structures 7 can increase carrier speeds. For example, a fin structure 7 composed of silicon germanium (SiGe) that is epitaxially formed on a semiconductor substrate 1 of silicon (Si) and having epitaxial oxide regions 4 of yttrium/lanthanum-oxide based systems, such as ($La_xY_{1-x}$)$_2O_3$, present in the fin cut openings separating the edges of adjacent fin structures 7 may have a compressive strain that increases carrier speeds in p-type semiconductor devices. The germanium content of the silicon germanium in the fin structure 7 may be as great at 25 at. %. It is noted that other strained semiconductor materials and epitaxial oxides 4 are suitable for use with the present disclosure. For example, the epitaxial oxide 4 may also be composed of, in some embodiments, when using yttrium/lanthanum-oxide based systems, such as ($La_xY_{1-x}$)$_2O_3$, the yttrium has to be the majority compound to ensure that a cubic lattice is formed. For example, the cubic lattice of the yttrium/lanthanum-oxide based systems matches well with the Si/SiGe lattice. In some embodiments, when the epitaxially deposited semiconductor material 6 is composed of silicon (Si) and germanium (Ge), the La—Y-oxide based interlayer system is only suitable for use with silicon germanium (SiGe) material having a germanium (Ge) content of 25 at. % or less. Other combinations of materials and compositions for the epitaxial oxide 4 and the epitaxially deposited semiconductor 6 are also possible. For example, the epitaxially deposited semiconductor material 6 may be any material that can be formed on the exposed surface of the semiconductor substrate 1. Epitaxial oxides might include a rare earth oxide. The rare earth oxide may include binary oxides, such as, e.g., gadolinium(III)-oxide ($Gd_2O_3$), dysprosium(III)-oxide ($Dy_2O_3$), holmium(III) oxide ($Ho_2O_3$), erbium (III) oxide ($Er_2O_3$), thulium (III) oxide ($Tm_2O_3$), lutetium(III) oxide ($Lu_2O_3$) or cerium (IV) oxide ($CeO_2$), etc. or ternary oxides including a rare earth metal, such as e.g., Gd, Er, Nd, La and Y forming oxides such as, e.g., lanthanum-yttrium oxide (($La_xY_{1-x}$)$_2O_3$), gadolinium-erbium oxide (($Gd_xEr_{1-x}$)$_2O_3$), neodymium-erbium oxide (($Nd_xEr_{1-x}$)$_2O_3$), neodymium-gadolinium oxide (($Nd_xGd_{1-x}$)$_2O_3$), lanthanum-erbium oxide (($La_xEr_{1-x}$)$_2O_3$), and combinations thereof. In some embodiments, the compressive strain may be equal to 200 MPa to 3 GPa. In another example, the fin structure 7 may be strained to have a tensile strain that ranges from 200 MPa to 3 GPa.

The semiconductor device may include a plurality of fin structures 7 having a uniform strain extending from edge E1 to edge E2 of each fin structure 7. By uniform strain it is meant that the amount of strain at the edges E1, E2 and the channel region of the fin structure 7, i.e., the portion of the fin structure 7 underlying the gate region 8, is substantially the same. The same is true of each point of the fin structure between the edges E1, E2 and the channel region. As described above, the uniform strain results from the present of epitaxial oxide 4 in direct contact with the edges E1, E2 separating adjacent fin structures 7. The epitaxial oxide 4 may be present in the fin cut opening, e.g., filling an entirety of the fin cut opening, that is present between the edges E1, E2 of said plurality of fin structures 7.

It is noted that the above process sequence describes a gate first process sequence for forming FinFETs. The present disclosure is not limited to only gate first processing. For example, gate last, which is also referred to as replacement gate processing, is also suitable for use with the methods and structures of the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a fin structure comprising:
    forming a hard mask on a semiconductor substrate of a first lattice dimension;
    etching first openings into a first portion of the semiconductor substrate exposed by the hard mask;
    forming an epitaxial oxide in the first openings, the epitaxial oxide having a second lattice dimension different than the semiconductor substrate;
    etching a second portion of the semiconductor substrate using the epitaxial oxide as an etch mask to form second openings in the semiconductor substrate;
    depositing an epitaxial semiconductor material in the second openings, the epitaxial semiconductor material having said second lattice dimension that is different than the first lattice dimension, wherein a difference between the first lattice dimension and the second lattice dimension induces a strain in the epitaxial semiconductor material; and
    patterning each region of epitaxial deposited semiconductor material to provide fin structures having said strain, wherein the epitaxial oxide is present in a fin cut space and obstructs relaxation of the fin strain.

2. The method of claim 1, wherein the hardmask is comprised of a dielectric material that is patterned using photolithography and etching.

3. The method of claim 1, wherein the semiconductor substrate comprises silicon, germanium, silicon germanium or a combination thereof.

4. The method of claim 3, wherein etching the first opening comprises anisotropic etching that is selective to the hard mask.

5. The method of claim 1, wherein the epitaxial oxide is selected from the group consisting of cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$) or combinations thereof.

6. The method of claim 1, wherein the epitaxial oxide is $(La_xY_{1-x})_2O_3$, wherein x ranges from 0.325 to 0.45; the semiconductor substrate is a silicon containing substrate; and the epitaxial semiconductor material is silicon germanium (SiGe), wherein the germanium content ranges up to 25 at. %.

7. The method of claim 1, wherein said depositing the epitaxial semiconductor material in the second openings comprises a germanium containing material.

8. The method of claim 7, wherein said depositing the epitaxial semiconductor material comprises epitaxially forming a silicon and germanium containing material on a silicon containing material of the semiconductor substrate, wherein said strain comprises a compressive strain.

9. The method of claim 7, wherein said depositing the epitaxial semiconductor material comprises epitaxially forming a silicon and carbon containing material on a silicon containing material of said semiconductor material, wherein said strain is a tensile strain.

10. The method of claim 1, wherein said patterning each region of said epitaxial deposited semiconductor material to provide said fin structures having said strain comprises a spacer image transfer process.

11. A method forming a semiconductor device comprising:
    providing regions of epitaxial oxide material of a second lattice dimension on a substrate of a first lattice dimension, wherein regions of the epitaxial oxide material separate regions of epitaxial semiconductor material having a lattice dimension equal to the second lattice dimension epitaxially formed on the substrate of the first lattice dimension to provide regions of strained semiconductor;
    patterning the regions of strained semiconductor to provide regions of strained fin structures, wherein the epitaxial oxide is present in the gate cut space to obstruct relaxation of the strained fin structures; and
    forming a gate structure on a channel region of the strained fin structures separating source and drain regions of the fin structures.

* * * * *